United States Patent
Richards

(10) Patent No.: US 9,246,667 B2
(45) Date of Patent: Jan. 26, 2016

(54) METHOD AND APPARATUS FOR CLOCK RECOVERY

(71) Applicant: Microchip Technology Incorporated, Chandler, AZ (US)

(72) Inventor: Patrick Kelly Richards, Peoria, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 14/200,456

(22) Filed: Mar. 7, 2014

(65) Prior Publication Data
US 2014/0270033 A1 Sep. 18, 2014

Related U.S. Application Data

(60) Provisional application No. 61/777,678, filed on Mar. 12, 2013.

(51) Int. Cl.
| | |
|---|---|
| H04L 7/00 | (2006.01) |
| G06F 13/42 | (2006.01) |
| G06F 1/12 | (2006.01) |
| H03L 7/06 | (2006.01) |
| H03L 1/02 | (2006.01) |

(52) U.S. Cl.
CPC .............. *H04L 7/0037* (2013.01); *G06F 1/12* (2013.01); *G06F 13/4295* (2013.01); *H03L 1/026* (2013.01); *H03L 7/06* (2013.01)

(58) Field of Classification Search
None
See application file for complete search history.

(56) References Cited

U.S. PATENT DOCUMENTS

| 8,356,201 B2 | 1/2013 | Newald | 713/500 |
|---|---|---|---|
| 9,032,239 B2 * | 5/2015 | Cai et al. | 713/503 |
| 2011/0182390 A1 | 7/2011 | Lin et al. | 375/371 |
| 2012/0072809 A1 * | 3/2012 | Kong et al. | 714/782 |
| 2014/0023163 A1 * | 1/2014 | Xu | 375/327 |

FOREIGN PATENT DOCUMENTS

| CN | 102790617 A | 11/2012 | H03L 7/18 |
|---|---|---|---|
| DE | 102007011684 A1 | 9/2008 | H04L 12/40 |

OTHER PUBLICATIONS

Richards ("AN754: Understanding Microchip's CAN Module Bit Timing," Microchip Technology Incorporated, pp. 1-13, Sep. 16, 2005).*
Etschberger, Konrad, "Controller Area Network—Grundlagen, Protokolle, Bausteine, Anwendungen," ISBN: 3-446-21776-2, vol. 3, pp. 98-113 (17 pages, with English translation), Dec. 31, 2002.
Richards, Pat, "AN754: Understanding Microchip's CAN Module Bit Timing," Microchip Technology Incorporated, 13 pages, Sep. 16, 2005.
International Search Report and Written Opinion, Application No. PCT/US2014/021996, 12 pages, Jun. 18, 2014.

* cited by examiner

*Primary Examiner* — Leon-Viet Nguyen
(74) *Attorney, Agent, or Firm* — Slayden Grubert Beard PLLC

(57) ABSTRACT

An integrated circuit device may have an internal oscillator for generating a system clock, a trimming logic with a trimming register for adjusting an oscillation frequency of the internal oscillator; a serial data receiver, wherein a serial data stream includes a synchronization signal. The synchronization signal is operable to indicate that the system clock correct, too fast or too slow. The device may further have a circuit for decoding the synchronization signal operable to re-adjust a value stored in the trimming register upon evaluation of the synchronization signal.

19 Claims, 5 Drawing Sheets

METHOD AND APPARATUS FOR CLOCK RECOVERY

CROSS-REFERENCE TO RELATED APPLICATIONS

This application claims the benefit of U.S. Provisional Application No. 61/777,678 filed on Mar. 12, 2013, which is incorporated herein in its entirety.

TECHNICAL FIELD

The present disclosure relates to a method and apparatus for clock recovery, in particular clock recovery of a Controller Area Network (CAN) bus signal.

BACKGROUND

CAN signals are asynchronous serial communication signals that do not provide for a separate clock signal. Hence, CAN uses an asynchronous transmission that embeds the clock signal in the transmitted serial data stream. A receiving device must then analyze this signal and reconstruct the clock to synchronize the device to the received serial stream. The Controller Area Network (CAN) protocol is an asynchronous serial bus with Non-Return to Zero (NRZ) bit coding designed for fast, robust communications in harsh environments, such as automotive and industrial applications. The CAN protocol allows the user to program the bit rate, the sample point of the bit, and the number of times the bit is sampled. With these features, the network can be optimized for a given application. The specific bit timing of the CAN protocol is discussed in the application note "Understanding Microchip's CAN Module Bit Timing", AN754, by Pat Richards, published in 2001 which is hereby incorporated by reference.

Timing within the receiving device is generally controlled by an internal or external oscillator of the receiving device. Such oscillators generally provide for limited timing resolution within the device. However, oscillator tolerance in a CAN system needs to be tighter than what is normally achievable with an internal oscillator across operating temperature ranges. This requires CAN modules to be clocked with an external source (crystal, clock, etc.). It is more desirable to have an internal clock source.

SUMMARY

Hence, a need exists for an improved device operable to receive a CAN signal with an internal clock source.

According to an embodiment, an integrated circuit device may comprise: an internal oscillator for generating a system clock, a trimming logic comprising a trimming register for adjusting an oscillation frequency of the internal oscillator; a serial data receiver, wherein a serial data stream includes a synchronization signal, wherein the synchronization signal is operable to indicate that the system clock correct, too fast or too slow; a circuit for decoding the synchronization signal operable to re-adjust a value stored in the trimming register upon evaluation of the synchronization signal.

According to a further embodiment, the integrated circuit device is can be a CAN protocol controller. According to a further embodiment, the serial data stream can be a CAN data stream. According to a further embodiment, the synchronization signal can be a synchronization jump width value in the serial data stream. According to a further embodiment, internal oscillator can be an RC oscillator. According to a further embodiment, the integrated circuit device furthermore may comprise a PLL coupled with the RC oscillator to provide the system clock. According to a further embodiment, the trimming register can be a configuration register of a microcontroller or CAN protocol controller. According to a further embodiment, the integrated circuit device may further comprise a CAN unit comprising a sync jump width processor generating a control signal dependent on the sync jump width value coupled with an oscillator tuning unit configured to increment or decrement the trimming register. According to a further embodiment, the integrated circuit device may further comprise a temperature sensor coupled with temperature register, wherein the temperature register is coupled with the oscillator tuning unit.

According to another embodiment, a method for operating an integrated circuit device may comprise generating a system clock by an internal oscillator, loading a trimming register to adjust an oscillation frequency of the internal oscillator; receiving a serial data stream by a serial data receiver, wherein the serial data stream includes a synchronization signal, wherein the synchronization signal is operable to indicate that the system clock correct, too fast or too slow; and evaluating the synchronization signal and depending on the synchronization signal re-adjusting a value stored in the trimming register.

According to a further embodiment of the method, the integrated circuit device can be a CAN protocol controller and the serial data stream can be a CAN data stream. According to a further embodiment of the method, the synchronization signal can be a synchronization jump width value in the serial data stream. According to a further embodiment of the method, the internal oscillator can be an RC oscillator. According to a further embodiment of the method, the method may further comprise multiplying an output frequency of the RC oscillator by a PLL to provide the system clock. According to a further embodiment of the method, the trimming register can be a configuration register of a microcontroller. According to a further embodiment of the method, the method may further comprise increment or decrement the trimming register by a predefined step value depending on the synchronization jump width value. According to a further embodiment of the method, the method may further comprise measuring a temperature of the integrated circuit device by an internal temperature sensor and trimming the oscillator frequency according to the temperature.

BRIEF DESCRIPTION OF THE DRAWINGS

A more complete understanding of the present disclosure may be acquired by referring to the following description taken in conjunction with the accompanying drawings wherein.

Figure 1:
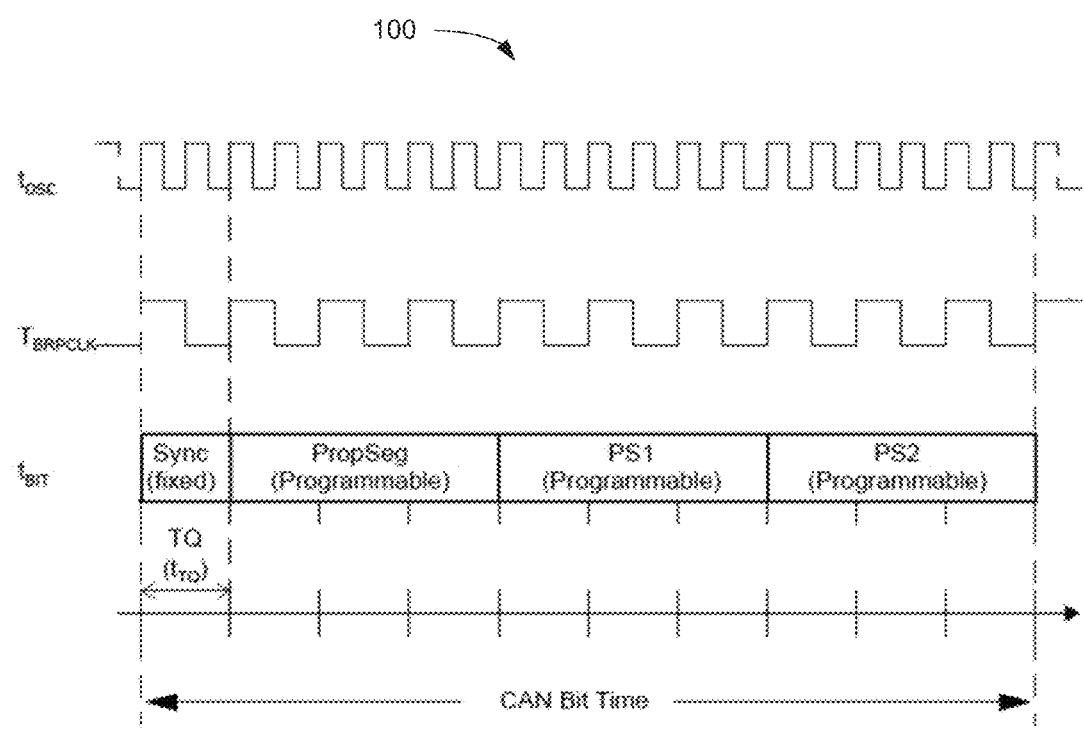
FIG. 1 show a timing diagram of the time quantum bit segments and bit period of a typical CAN signal

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents.

DETAILED DESCRIPTION

Various embodiments allow for the recovery of the CAN clock in an asynchronous received signal so the internal oscillator can be dynamically calibrated. An internal oscillator of a receiving device operating according to the CAN protocol can be dynamically calibrated, for example, by monitoring the synchronization jump width (SJW) phase adjustments signals and calibrating the oscillator as needed.

Integrated oscillators typically operate with an internal resistor-capacitor oscillation circuit. Various internal circuitry may be used, in particular phase lock loop circuits and other circuitry to stabilize clock signals generated by such circuits. To reduces costs, microcontrollers often use such internal circuits thereby avoiding external oscillators such as crystals. Integrated oscillators of, for example, such microcontrollers drift over time, voltage and temperature, in particular substantially more than external crystal oscillators. Internal oscillators drift too much over temperature to allow use with the CAN module. However, according to various embodiments, the need for an external clock with low PPM variation is avoided.

According to various embodiments, the synchronization jump width (SJW) mechanism in the CAN module, which automatically adjusts a given bit time when in receive mode to stay in sync with the transmitting node, as discussed in more detail in the above mentioned application note AN754, can be used to dynamically trim the internal oscillator to match the transmitting node's oscillator.

As mentioned above, the clock signal is not sent as a separate part of the CAN signal. CAN specifies a worst case oscillator tolerance of 1.58% and many systems require much tighter tolerance, particularly automotive systems which can require a 0.3% tolerance across automotive temperature ranges (−40° C. to +125° C.). Thus, according to various embodiments, to meet these specifications the internal oscillator of the receiving device can be dynamically calibrated to compensate for internal oscillator drift over temperature and voltage, to eliminate the need for an external clock source.

Figure 2:
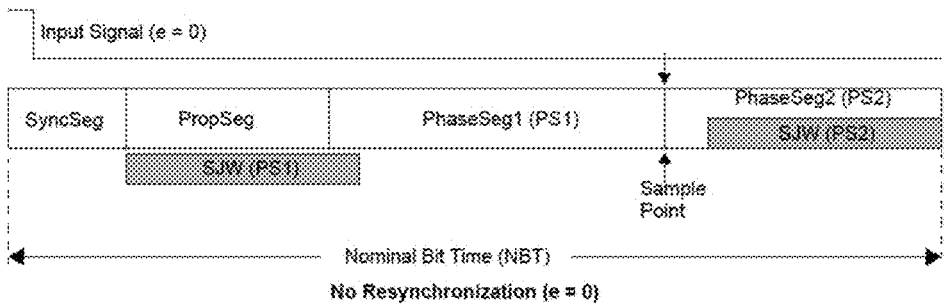
FIG. 2 is a timing diagram of scenarios of a typical received CAN signal.
Figure 2:
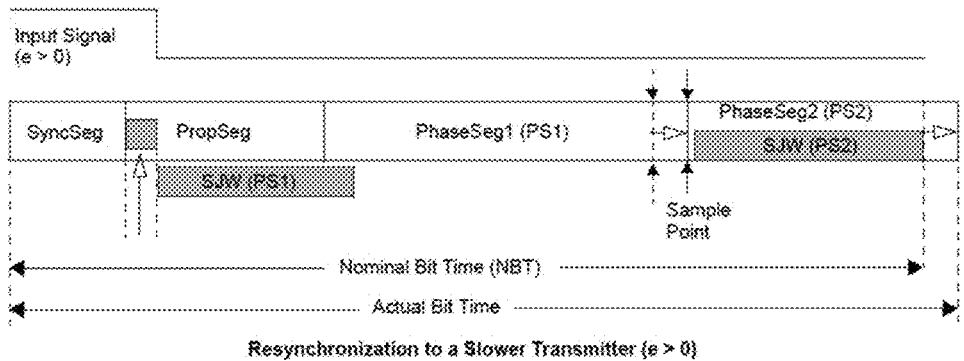
Figure 2:
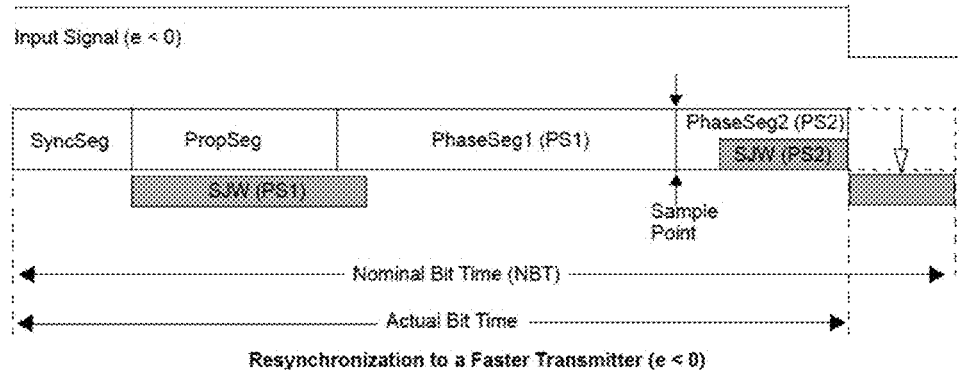
Figure 3:
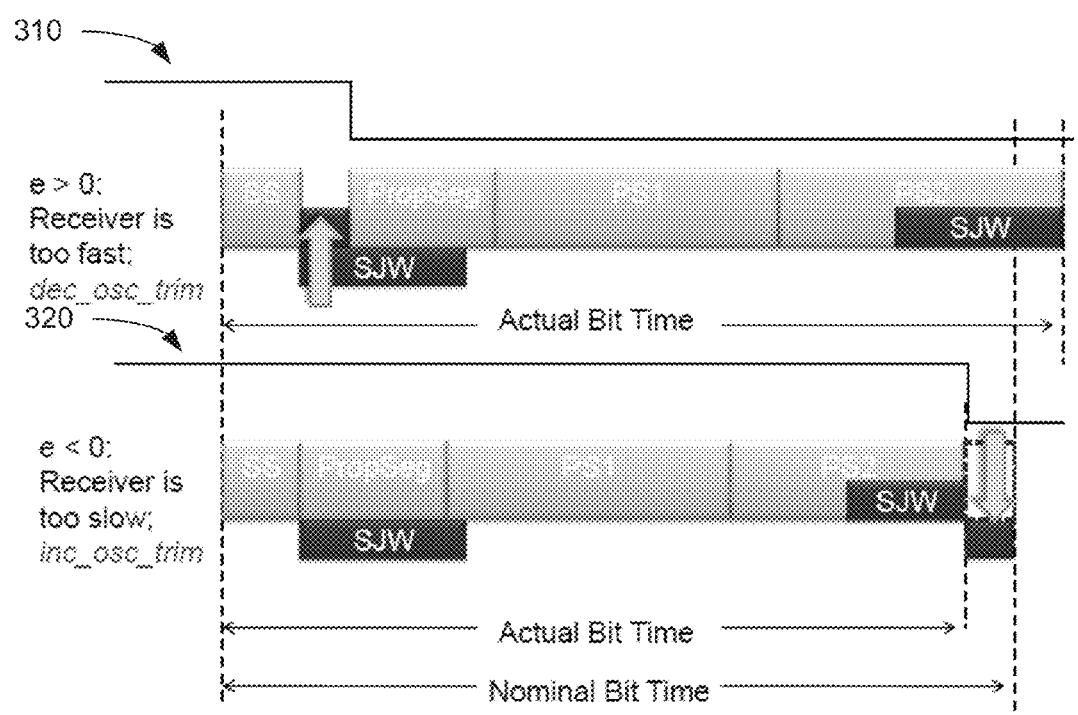
FIG. 3 is another timing diagram including logic signals generated according to various embodiments.

The clock signal of the transmitting node can be revealed by monitoring the phase errors using the Synchronization Jump Width (SJW) mechanism built into the CAN engine. The internal oscillator can be adjusted up/down based on the phase error of the SJW signal. FIGS. 2 and 3 show how the SJW signal is used to add/subtract Time Quanta (TQ) on a received bit depending on the phase error polarity of the actual transition edge.

As shown in FIG. 1, a CAN bit time is made up of non-overlapping segments. Each of these segments are made up of integer units called Time Quanta (TQ). The Nominal Bit Rate (NBR) is defined in the CAN specification as the number of bits per second transmitted by an ideal transmitter with no resynchronization and can be described with the equation:

$$NBR = f_{bit} = 1/t_{bit}$$

The Nominal Bit Time (NBT), or $t_{bit}$, is made up of non-overlapping segments SS, PropSeg, PS1, and PS2, therefore, the NBT is the summation of the following segments:

$$T_{bit} = t_{SyncSeg} + t_{PropSeg} + t_{PS1} + t_{PS2}$$

Associated with the NBT are the Sample Point, Synchronization Jump Width (SJW), and Information Processing Time (IPT). The Synchronization Segment (SyncSeg) is the first segment in the NBT and is used to synchronize the nodes on the bus. Bit edges are expected to occur within the SyncSeg. This segment is fixed at 1TQ. The Propagation Segment (PropSeg) exists to compensate for physical delays between nodes. The propagation delay is defined as twice the sum of the signal's propagation time on the bus line, including the delays associated with the bus driver. The PropSeg is programmable from 1-8TQ. SJW overlays the following segments PS1 and PS2 and can be programmed from 1-4 TQ. PS1 is programmable from 1-8TQ and PS2 is programmable from 2-8TQ. The sample point is the point in the bit time in which the logic level is read and interpreted. The sample point is located at the end of phase segment 1. The exception to this rule is, if the sample mode is configured to sample three times per bit. In this case, the bit is still sampled at the end of PS1, however, two additional samples are taken at one-half TQ intervals prior to the end of PS1 and the value of the bit is determined by a majority decision. The Information Processing Time (IPT) is the time required for the logic to determine the bit level of a sampled bit. The IPT begins at the sample point, is measured in TQ and is fixed for the CAN module, for example in some cases it may assume 2TQ. Since phase segment 2 also begins at the sample point and is the last segment in the bit time, it may be required that PS2 minimum is not less than the IPT. Therefore, according to one scenario:

$$PS2_{min} = IPT = 2TQ$$

The Synchronization Jump Width (SJW) adjusts the bit clock as necessary by 1-4TQ as configured) to maintain synchronization with the transmitted message. Each of the segments that make up a bit time are made up of integer units called Time Quanta (TQ). The length of each Time Quantum is based on the oscillator period ($t_{OSC}$). The base TQ equals twice the oscillator period.

FIG. 1 shows how the bit period is derived from $t_{OSC}$ and TQ. The TQ length equals one TQ Clock period ($t_{BRPCLK}$), which is programmable using a programmable prescaler named the Baud Rate Prescaler (BRP). This is shown in the following equation:

$$TQ = 2 \cdot BRP \cdot T_{OSC} = \frac{2 \cdot BRP}{F_{OSC}}$$

All nodes on the CAN bus must have the same nominal bit rate. Noise, phase shifts, and oscillator drift can create situations where the nominal bit rate does not equal the actual bit rate in a real system. Therefore, the nodes must have a method for achieving and maintaining synchronization with bus messages.

The bit timing for each node in a CAN system is derived from the reference frequency ($f_{OSC}$) of its node. This creates a situation where phase shifting and oscillator drift will occur between nodes due to less than ideal oscillator tolerances between the nodes. The CAN specification indicates that the worst case oscillator tolerance is 1.58% and is only suitable for low bit rates (125 kb/s or less).

The CAN protocol has defined a recessive (logic 1) and dominant (logic 0) state to implement a non-destructive bit-wise arbitration scheme. It is this arbitration methodology that is affected the most by propagation delays. Each node involved with arbitration must be able to sample each bit level within the same bit time. For example, if two nodes at opposite ends of the bus start to transmit their messages at the same time, they must arbitrate for control of the bus. This arbitration is only effective if both nodes are able to sample during the same bit time. Extreme propagation delays (beyond the sample point) will result in invalid arbitration. This implies that bus lengths are limited at given CAN data rates. A CAN system's propagation delay is calculated as being a signal's round trip time on the physical bus ($t_{bus}$), the output driver delay ($t_{drv}$), and the input comparator delay ($t_{cmp}$). Assuming all nodes in the system have similar component delays, the propagation delay is explained mathematically as:

$$t_{prop}=2(t_{bus}+t_{cmp}+t_{drv})$$

All nodes on a given CAN bus must have the same NBT. The NRZ bit coding does not encode a clock into the message. The receivers must synchronize to the transmitted data stream to insure messages are properly decoded. There are two methods used for achieving and maintaining synchronization. Hard Synchronization only occurs on the first recessive-to-dominant (logic "1" to "0") edge during a bus idle condition, which indicates a Start-of-Frame (SOF) condition. Hard synchronization causes the bit timing counter to be reset to the SyncSeg which causes the edge to lie within the SyncSeg. At this point, all of the receivers will be synchronized to the transmitter. Hard synchronization occurs only once during a message. Also, resynchronization may not occur during the same bit time (SOF) that hard synchronization occurred.

Resynchronization is implemented to maintain the initial synchronization that was established by the hard synchronization. Without resynchronization, the receiving nodes could get out of synchronization due to oscillator drift between nodes. Resynchronization is achieved by implementing a Digital Phase Lock Loop (DPLL) function which compares the actual position of a recessive-to-dominant edge on the bus to the position of the expected edge (within the SyncSeg) and adjusting the bit time as necessary. The phase error of a bit is given by the position of the edge in relation to the SyncSeg, measured in TQ, is shown in FIG. 2 and is defined as follows:

Example 210 in FIG. 2: e=0; the edge lies within the SyncSeg.

Example 220 in FIG. 2: e>0; the edge lies before the sample point. (TQ added to PS1).

Example 230 in FIG. 2: e<0; the edge lies after the sample point of the previous bit. (TQ subtracted from PS2)

FIG. 2 shows how phase errors, other than zero, cause the bit time to be lengthened or shortened, wherein 1) Only recessive-to-dominant edges will be used for synchronization; 2) Only one synchronization within one bit time is allowed; 3) An edge will be used for synchronization only if the value at the previous sample point differs from the bus value immediately after the edge; 4) A transmitting node will not resynchronize on a positive phase error (e>0). This implies that a transmitter will not resynchronize due to propagation delays of it's own transmitted message. The receivers will synchronize normally; and 5) If the absolute magnitude of the phase error is greater than the SJW, then the appropriate phase segment will be adjusted by an amount equal to the SJW.

Thus, as shown in FIG. 3, if the SJW controller detects a positive phase error, the receiver's oscillator is too fast with respect to the transmitting node. The SJW will add the pre-configured time quantum (TQ) as normally occurs in CAN as mentioned above. However, in addition, according to various embodiments, as shown in FIG. 3 the phase error signal will also trigger a state machine to slow the oscillator in the trim register. To this end, as shown with signal 310 the SJW controller sends a signal dec_osc_trim to the state machine which causes the trim register to be adjusted accordingly, for example by subtracting a predefined step value. The trim register controls the actual oscillation frequency of the internal RC oscillator.

Likewise, if the phase error is negative, as shown with signal 320 the receiver is too slow with respect to the transmitting node. The SJW controller shortens the bit in question by the TQ, and also adjusts the oscillator trim register using signal inc_osc_trim accordingly. Thus, the trim register will be incremented by a predefined step value. There may be separate control signals for incrementing and decrementing as shown, for example, the signals may use the transition from high to low to signal that a respective adjustment must be made. Other signals may be used to increment or decrement the oscillator frequency. It is to be noted that the internal oscillator is stable at constant temperatures. Adjustments would only be needed if the temperature changes enough to cause phase errors in the SJW due to oscillator drift.

Most effort in a microcontroller unit (MCU) is to develop a more stable internal oscillator to address the need for multiple peripherals. While a CAN peripheral is not realized in every microcontroller, other peripheral device may also benefit from a more stable oscillator. The focus has most likely been the 80/20 rule.

Figure 4:
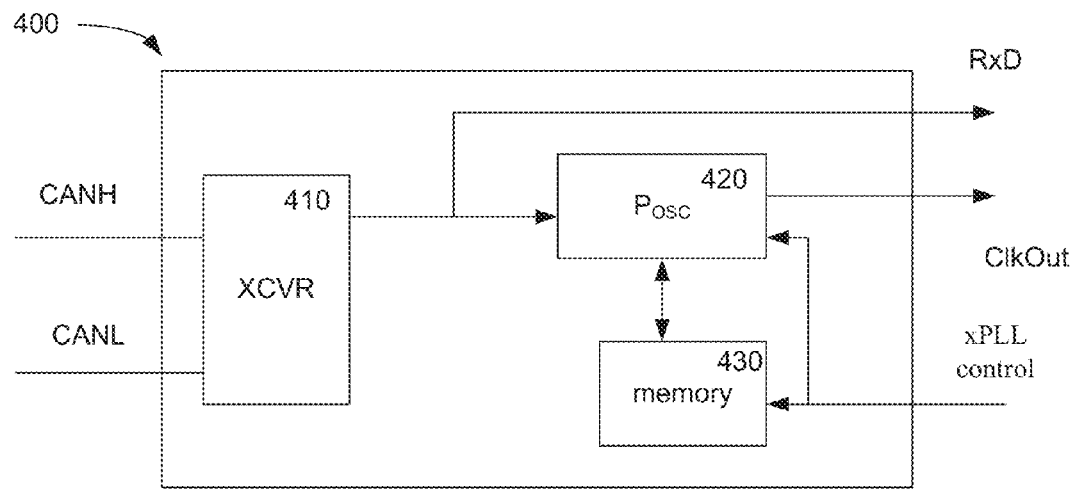
FIG. 4 is a general block diagram of a programmable oscillator according to various embodiments.

FIG. 4 shows a CAN peripheral module 400 in an integrated circuit device, for example a microcontroller, that provides for an additional output signal for re-calibrating the internal oscillator of a microcontroller. The internal RC oscillator of the device comprises an adjustment unit including, for example, a register which is programmable to fine adjust the output frequency of the internal oscillator. Thus, trimming data can be usually programmed by a user to adjust the oscillator when its output frequency has drifted from an initial factory adjustment. According to an embodiment as shown in FIG. 4, the adjustment signal provided by the CAN transceiver 410 may be stored in a volatile or non-volatile memory 430 which may operate as a trimming register for oscillator 420. According to an embodiment, the CAN module may integrate respective logic and directly write into the trimming register 420. Thus, a user does not need to program the device to readjust the trimming value.

Figure 5:
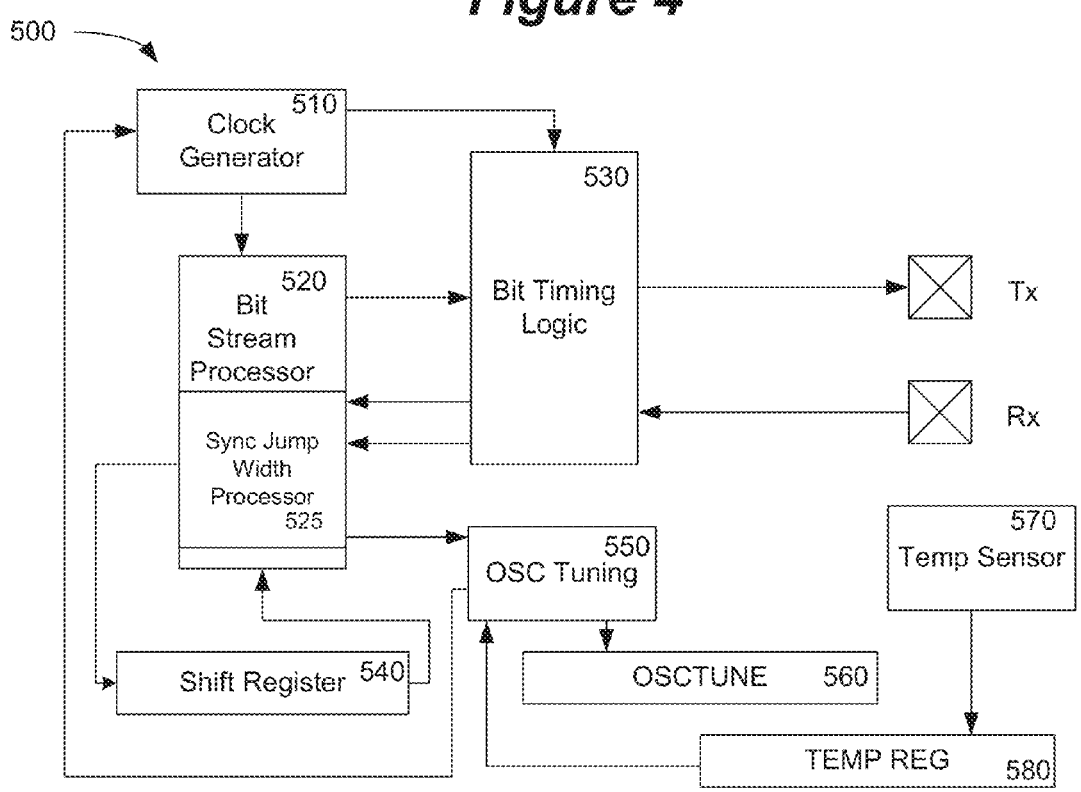
FIG. 5 is a detailed block diagram of a receiving device.

FIG. 5 shows a more detailed block diagram of a CAN module 500 that can be integrated within a microcontroller according to various embodiments. Here, the system clock is provided by unit 510 which can be fine adjusted by oscillator tuning block 550. This tuning block 550 may be coupled with register OSCTUNE 560. According to some embodiments, an additional temperature sensor 570 may be integrated with the microcontroller. Temperature data can be retrieved from an optional temperature register 580 which is also coupled with tuning block 550. Tuning block 550 is configured to automatically adjust the system clock oscillator 510 when an up or down adjustment is received from the CAN unit 520, 530, 540 in particular, sync jump width processor 525 which may be part of the bit stream processor 520 coupled with bit timing logic 530 which again is coupled with the pins TX and RX. A shift register 540 is also shown which may be used to assemble the incoming data signal. According to some embodiments, tuning circuitry 550 may further automatically adjust the oscillating frequency according to an internal algorithm depending on the present temperature measured by an optional temperature sensor 570.

Figure 6:
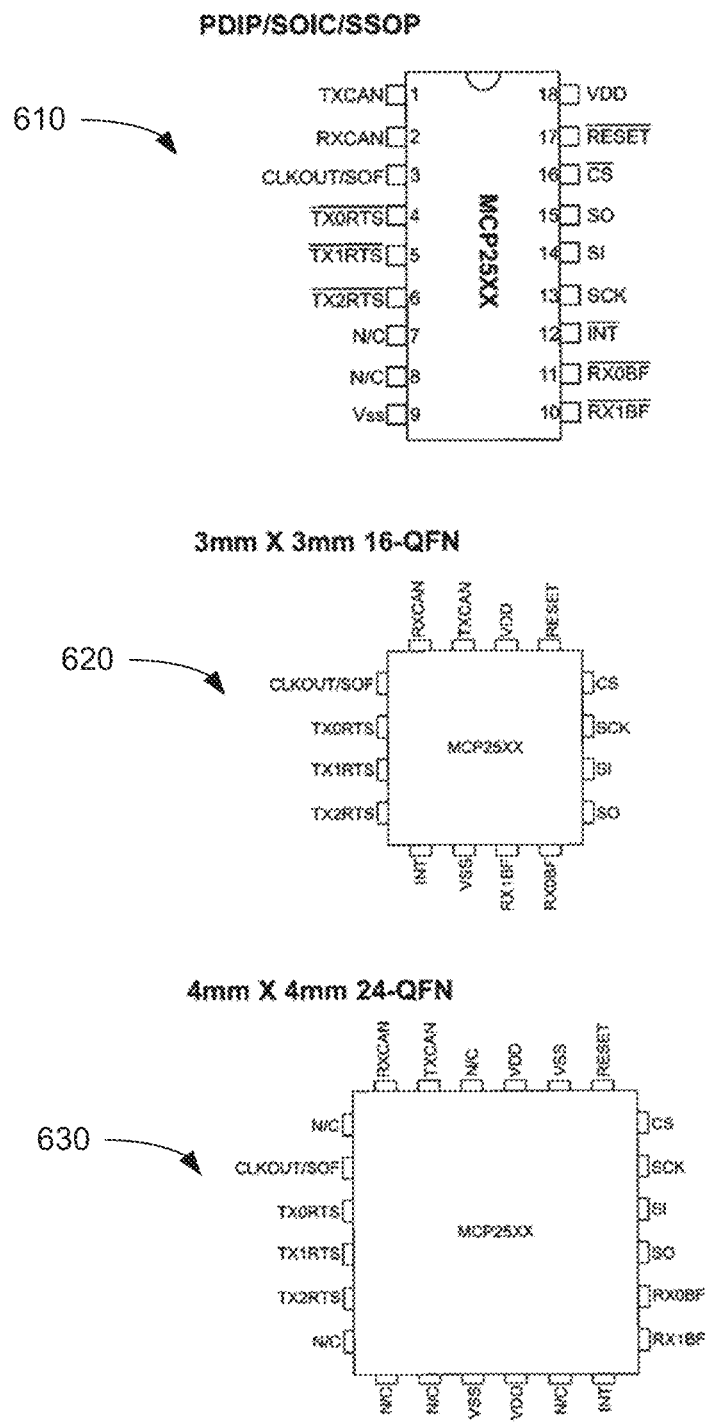
FIG. 6 shows a plurality of possible packages of integrated circuit devices according to various embodiments.

FIG. 6 shows various embodiments 610, 620, 630 of housings comprising integrated CAN controllers and the capabilities according to the present disclosure using different packages such as dual in-line and various surface mount packages as known in the art. The different packages are merely examples.

What is claimed is:

1. An integrated circuit device comprising
an internal oscillator for generating a system clock,
a trimming logic comprising a trimming register for adjusting an oscillation frequency of the internal oscillator;
a CAN protocol controller comprising:
  a serial data receiver using the system clock or a clock derived from the system clock to sample a received serial data stream, wherein a received serial CAN data stream includes a synchronization signal, wherein the synchronization signal is operable to indicate that the system clock is correct, too fast or too slow; and
  a circuit for decoding the synchronization signal operable to re-adjust a value stored in the trimming register upon evaluation of the synchronization signal.

2. The integrated circuit device according to claim 1, wherein the integrated circuit device is a stand alone CAN protocol controller.

3. The integrated circuit device according to claim 1, wherein the integrated circuit device is a microcontroller, wherein the internal oscillator provides the system clock of the microcontroller.

4. The integrated circuit device according to claim 1, wherein the synchronization signal is a synchronization jump width value in said serial data stream.

5. The integrated circuit device according to claim 1, wherein internal oscillator is an RC oscillator.

6. The integrated circuit device according to claim 5, wherein the integrated circuit device furthermore comprises a PLL coupled with the RC oscillator to provide the system clock.

7. The integrated circuit device according to claim 1, wherein the trimming register is a configuration register of a microcontroller or CAN protocol controller.

8. The integrated circuit device according to claim 4, further comprising a CAN unit comprising a sync jump width processor generating a control signal dependent on the sync jump width value coupled with an oscillator tuning unit configured to increment or decrement the trimming register.

9. The integrated circuit device according to claim 8, further comprising a temperature sensor coupled with temperature register, wherein the temperature register is coupled with said oscillator tuning unit.

10. A method for operating an integrated circuit device comprising a CAN protocol controller, the method comprising the steps of:
  generating a system clock by an internal oscillator,
  loading a trimming register to adjust an oscillation frequency of the internal oscillator;
  receiving a serial CAN data stream by a serial data CAN receiver and sampling the received serial data stream using the system clock or a clock derived from the system clock, wherein the serial CAN data stream includes a synchronization signal, wherein the synchronization signal is operable to indicate that the system clock correct, too fast or too slow; and
  evaluating the synchronization signal and depending on the synchronization signal re-adjusting a value stored in the trimming register.

11. The method according to claim 10, wherein the integrated circuit device is a microcontroller, wherein the internal oscillator provides the system clock of the microcontroller.

12. The method according to claim 10, wherein the integrated circuit device is a stand alone CAN controller.

13. The method according to claim 12, wherein the synchronization signal is a synchronization jump width value in said serial data stream.

14. The method according to claim 10, wherein the internal oscillator is an RC oscillator.

15. The method according to claim 14, further comprising multiplying an output frequency of the RC oscillator by a PLL to provide the system clock.

16. The method according to claim 10, wherein the trimming register is a configuration register of a microcontroller.

17. The method according to claim 13, further comprising increment or decrement the trimming register by a predefined step value depending on the synchronization jump width value.

18. The method according to claim 17, further comprising measuring a temperature of the integrated circuit device by an internal temperature sensor and trimming said oscillator frequency according to the temperature.

19. An integrated circuit device comprising
an internal oscillator for generating a system clock,
a trimming logic comprising a trimming register wherein a value in the trimming register changes an oscillation frequency of the internal oscillator;
a serial data receiver using the system clock or a clock derived from the system clock to sample a received serial data stream, wherein the serial data stream includes a synchronization signal, wherein the synchronization signal is operable to indicate that the system clock correct, too fast or too slow; and
a circuit for decoding the synchronization signal operable to re-adjust a value stored in the trimming register upon evaluation of the synchronization signal.

* * * * *